United States Patent
Regau et al.

(10) Patent No.: US 10,531,536 B2
(45) Date of Patent: Jan. 7, 2020

(54) OPTOELECTRONIC ASSEMBLY AND METHOD FOR OPERATING AN OPTOELECTRONIC ASSEMBLY

(71) Applicant: OSRAM OLED GmbH, Regensburg (DE)

(72) Inventors: Kilian Regau, Regensburg (DE); Joerg Farrnbacher, Regensburg (DE); Benjamin Hoeflinger, Regensburg (DE); Thorsten Vehoff, Regensburg (DE); Tobias Pohl-Zander, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/748,666

(22) PCT Filed: Jul. 28, 2016

(86) PCT No.: PCT/EP2016/068041
§ 371 (c)(1),
(2) Date: Jan. 30, 2018

(87) PCT Pub. No.: WO2017/021276
PCT Pub. Date: Feb. 9, 2017

(65) Prior Publication Data
US 2018/0220509 A1    Aug. 2, 2018

(30) Foreign Application Priority Data
Jul. 31, 2015    (DE) .................. 10 2015 112 635

(51) Int. Cl.
*H05B 37/02*    (2006.01)
*H05B 33/08*    (2006.01)
*H01L 27/32*    (2006.01)

(52) U.S. Cl.
CPC ..... *H05B 33/0896* (2013.01); *H01L 27/3209* (2013.01); *H05B 33/0854* (2013.01); *H05B 37/02* (2013.01)

(58) Field of Classification Search
CPC ..................... H05B 33/0896; H05B 37/02
(Continued)

(56) References Cited

U.S. PATENT DOCUMENTS 6,313,589 B1    11/2001    Kobayashi et al.
7,576,493 B2    8/2009    Huang
(Continued)

FOREIGN PATENT DOCUMENTS

DE    102013107225 A1    1/2015
WO    2014037908 A1    3/2014

OTHER PUBLICATIONS

German Search Report based on application No. 10 2015 112 635.4 (10 pages) dated Feb. 4, 2016 (for reference purpose only).
(Continued)

*Primary Examiner* — Thuy V Tran
(74) *Attorney, Agent, or Firm* — Viering Jentschura & Partner MBB

(57) ABSTRACT

An optoelectronic assembly and method for operating an optoelectronic assembly are provided. In some aspects, the optoelectronic assembly includes an organic light-emitting component, a temperature sensor configured to record a temperature value, and a driver circuit coupled to the organic light-emitting component and the temperature sensor. The driver circuit is configured to apply an AC voltage to the organic light-emitting component when the organic light-emitting component is switched on, and if the recorded temperature value is less than a predetermined temperature threshold value, where the AC voltage is, at least, temporarily less than an instantaneous threshold voltage of the organic light-emitting component. The driver circuit is also configured to apply a DC voltage to the organic light-emitting component if a measurement value is greater than or equal to a predetermined threshold value, where the DC
(Continued)

voltage is greater than the instantaneous threshold voltage of the organic light-emitting component.

21 Claims, 5 Drawing Sheets

(58) Field of Classification Search
USPC .................. 315/185 R, 291, 307, 308, 309
See application file for complete search history.

(56) References Cited

U.S. PATENT DOCUMENTS

| | | | |
|---|---|---|---|
| 8,866,402 B2* | 10/2014 | Yang | H05B 33/0809 |
| | | | 307/32 |
| 2006/0202914 A1 | 9/2006 | Ashdown | |
| 2009/0066267 A1* | 3/2009 | Kraus | H05B 33/083 |
| | | | 315/313 |
| 2011/0266958 A1* | 11/2011 | Tsai | H05B 33/0809 |
| | | | 315/152 |
| 2012/0249516 A1 | 10/2012 | Wacyk et al. | |
| 2012/0280636 A1* | 11/2012 | Roberts | H05B 33/0896 |
| | | | 315/294 |
| 2014/0117853 A1* | 5/2014 | Miyamichi | H05B 33/0815 |
| | | | 315/119 |

OTHER PUBLICATIONS

International Search Report based on application No. PCT/EP2016/068041 (6 pages + 3 pages English translation) dated Oct. 31, 2016 (for reference purpose only).

\* cited by examiner

OPTOELECTRONIC ASSEMBLY AND METHOD FOR OPERATING AN OPTOELECTRONIC ASSEMBLY

CROSS-REFERENCE TO RELATED APPLICATIONS

This patent application is a national stage entry of International Application No. PCT/EP2016/068041 under 35 U.S.C. §§ 365 and 371, filed on Jul. 28, 2016, which claims priority to German Patent Application Serial No. 10 2015 112 635.4, which was filed on Jul. 31, 2015. The disclosures of each of the foregoing documents are incorporated herein by reference in their entirety and for all purposes.

FIELD

The present disclosure relates to an optoelectronic assembly and to a method for operating an optoelectronic assembly.

BACKGROUND

A conventional optoelectronic assembly includes an organic light-emitting component, for example an OLED, a controller and one, two or more measuring devices for recording corresponding measurement values. The controller controls and/or regulates the organic light-emitting component as a function of the measurement values. The controller may be referred to as a driver. During normal operation, the organic light-emitting component is in luminescent operation, in which light is generated.

In organic light-emitting components, during normal operation the forward voltage often has a strong temperature dependency. In particular, the forward voltage may be relatively high at low temperatures and the forward voltage may be relatively low at high temperatures. The strong temperature dependency of the forward voltage of an OLED may constitute a problem.

SUMMARY

In order to resolve this problem, for example, the controller may be configured so that it can provide an output voltage which is variable in a very large range. In other words, strong voltage variations can be accepted and the controller, for example a driver, can be configured for the high required voltage. In particular, the controller may be configured for operation of the organic light-emitting component at cold temperatures very strongly in terms of power technology, since the forward voltage required by the organic light-emitting component increases greatly at low temperatures. This may on the one hand lead to high costs, and on the other hand is not always possible, particularly for applications in which the output voltage of the controller is limited by technology and/or standards. As an example in this regard, use of the optoelectronic assembly in a motor vehicle, particularly an automobile, is mentioned, in which the available battery voltage of the corresponding motor vehicle less voltage dips exists as a technical limitation. If the voltage needs to be stepped up, an additional technical and/or cost outlay is incurred. There may also be a limitation by standards in general lighting. Depending on the application, this leads to a significantly higher extra insulation outlay, particularly when the voltage is not limited to, for example, 34 V DC voltage or 60 V DC voltage. If these limits need to be exceeded merely because of cold temperatures, this entails a significant extra cost outlay. Because of the low-temperature behavior of OLEDs, it is therefore necessary to change over to other particularly expensive and/or less efficient circuit topologies.

It is one aspect of the present disclosure to provide an optoelectronic assembly which can be operated in a wide temperature range, in particular at low temperatures, with a low power, in particular with a low forward voltage, and/or can be produced simply and economically.

It is one aspect of the present disclosure to provide a method for operating an optoelectronic assembly, which can be carried out in a wide temperature range, in particular at low temperatures, with a low power, in particular with a low forward voltage, and/or simply and economically.

One aspect of the present disclosure may be achieved by an optoelectronic assembly having an organic light-emitting component, a temperature sensor for recording a temperature value, and a controller which is coupled to the organic light-emitting component and to the temperature sensor. The controller is configured to apply an AC voltage to the organic light-emitting component when the organic light-emitting component is switched on, which voltage is at least temporarily less than an instantaneous threshold voltage of the organic light-emitting component, if the recorded temperature value is less than a predetermined temperature threshold value, and to apply a DC voltage to the organic light-emitting component, which voltage is greater than the instantaneous threshold voltage of the organic light-emitting component, if a measurement value is equal to or greater than a predetermined threshold value.

During normal operation, the organic light-emitting component is operated with the DC voltage, and therefore supplied with direct current. With the aid of the AC voltage, electrical power can be introduced into the organic light-emitting component before normal operation, and the organic light-emitting component can thus be heated before normal operation. In other words, heat energy can be applied or introduced into the organic light-emitting component by means of the AC voltage after switching on and before normal operation of the organic light-emitting component. The heated organic light-emitting component may then be operated with a low forward voltage and/or a low power during normal operation.

By means of the alternating current, with the same performance of the controller, greater heat energy can be introduced and the heat energy can be introduced more rapidly than by means of the direct current during normal operation of the organic light-emitting component. No additional terminals on the organic light-emitting component are required for the application of the AC voltage. No additional heating elements are required for the heating of the organic light-emitting component. Rapid heating of the organic light-emitting component, and therefore economical and/or simple operation of the optoelectronic assembly, are therefore possible by means of a simple and/or economical controller.

That the AC voltage is at least temporarily less than the instantaneous threshold voltage of the organic light-emitting component may, for example, mean that the AC voltage oscillates about a voltage value below the instantaneous threshold voltage, and lies above the instantaneous threshold voltage only in short time intervals around the oscillation maxima. That the threshold voltage is instantaneous means that the threshold voltage is dependent on the temperature and is not a rigidly predetermined value, and that the controller uses the threshold voltage corresponding to the instantaneous time as a reference for the controlling. The instantaneous threshold voltage may, for example, be recorded during operation of the optoelectronic assembly, or it may be determined in the factory as a function of the temperature and stored on a storage medium of the optoelectronic assembly, so that the controller can read the instantaneous threshold voltage from the storage medium as a function of the temperature recorded. The predetermined temperature threshold value may, for example, be determined empirically in the factory and stored on a storage medium of the optoelectronic assembly.

In one refinement, the controller is configured in such a way that the AC voltage is always less than the instantaneous threshold voltage of the organic light-emitting component. The effect of this is that the organic light-emitting component does not shine during the heating, and the heating process is therefore not externally perceptible. Furthermore, no current flows through the organic layers of the organic light-emitting component during the heating, for which reason they are not subjected to any substantial wear during the heating, so that the lifetime of the organic light-emitting component is not affected by the heating process.

In one refinement, the measurement value is a further temperature value and the threshold value is the temperature threshold value. In other words, the instantaneous temperature of the organic light-emitting component may be recorded once, two times or several times during the heating, and depending on the instantaneous temperature the heating process may then be ended and/or normal operation may be adopted. As an alternative thereto, the measurement value may be a current value of a forward current which flows through the organic light-emitting component, or a time value of a time duration which has elapsed since the start of the heating process. This can straightforwardly contribute to identifying when the heating process may be ended and normal operation, in particular luminescent operation, of the organic light-emitting component may be adopted.

One aspect of the present disclosure may be achieved by an optoelectronic assembly having an organic light-emitting component, a sensor for recording a measurement value, and a controller which is coupled to the organic light-emitting component. The controller is configured to apply an AC voltage to the organic light-emitting component when the organic light-emitting component is switched on, which voltage is less than an instantaneous threshold voltage of the organic light-emitting component, and to apply a DC voltage to the organic light-emitting component after the organic light-emitting component is switched on, which voltage is greater than the instantaneous threshold voltage of the organic light-emitting component, if the measurement value is equal to or greater than a predetermined threshold value.

Each time the organic light-emitting component is switched on, therefore, the organic light-emitting component is operated at least briefly with the AC voltage, in particular independently of the instantaneous temperature. In this way, a heating process can in principle be initiated when switching on. The heating process, however, is always carried out in such a way that the AC voltage lies fully below the instantaneous threshold voltage of the organic light-emitting component, so that the organic light-emitting component does not shine during the heating, which has the advantages already explained above.

In one refinement, the optoelectronic assembly includes a temperature sensor for recording a temperature value, the measurement value being the temperature value and the threshold value being a predetermined temperature threshold value. This can straightforwardly contribute to identifying when the heating process may be ended and normal operation, in particular luminescent operation, of the organic light-emitting component may be adopted.

In one refinement, the optoelectronic assembly includes a current sensor for recording a current value of a forward current which flows through the organic light-emitting component, the measurement value being the current value and the threshold value being a predetermined current threshold value. This can contribute to straightforwardly identifying when the heating process may be ended and normal operation, in particular luminescent operation, of the organic light-emitting component may be adopted. The predetermined current threshold value may, for example, be determined empirically in the factory and stored on a storage medium of the optoelectronic assembly.

In one refinement, the optoelectronic assembly includes a clock for recording a time duration which has elapsed since the organic light-emitting component was switched on, the measurement value corresponding to the time duration and the threshold value being a predetermined time threshold value. This can contribute to straightforwardly identifying when the heating process may be ended and normal operation, in particular luminescent operation, of the organic light-emitting component may be adopted. The predetermined time threshold value may, for example, be determined empirically in the factory and stored on a storage medium of the optoelectronic assembly.

One aspect of the present disclosure may be achieved by a method for operating an optoelectronic assembly which includes an organic light-emitting component. In the method, when the organic light-emitting component is switched on, the temperature value is recorded. The AC voltage is applied to the organic light-emitting component, which voltage is at least temporarily less than an instantaneous threshold voltage of the organic light-emitting component, if the recorded temperature value is less than the predetermined temperature threshold value. The DC voltage is applied to the organic light-emitting component, which voltage is greater than the instantaneous threshold voltage of the organic light-emitting component, if the measurement value is equal to or greater than the predetermined threshold value.

In one refinement, the AC voltage is always less than the instantaneous threshold voltage of the organic light-emitting component, which has the advantages described above.

In one refinement, the measurement value is a further temperature value and the threshold value is the temperature threshold value, which has the advantages described above.

One aspect of the present disclosure may be achieved by a method for operating an optoelectronic assembly which includes an organic light-emitting component. In the method, an AC voltage is applied to the organic light-emitting component when the organic light-emitting component is switched on, which voltage is less than the instantaneous threshold voltage of the organic light-emitting component. After the organic light-emitting component is switched on, the measurement value is recorded, and the DC voltage is applied to the organic light-emitting component, which voltage is greater than the instantaneous threshold voltage of the organic light-emitting component, if the measurement value is equal to or greater than a predetermined threshold value.

In one refinement, the measurement value is the temperature value and the threshold value is the predetermined temperature threshold value.

In one refinement, the measurement value is the current value of the forward current which flows through the organic light-emitting component, and the threshold value is the predetermined current threshold value.

In one refinement, the measurement value corresponds to a time duration which has elapsed since the organic light-emitting component was switched on, and the threshold value is the predetermined time threshold value.

In one refinement, the AC voltage is selected in such a way that a root mean square current value of the alternating current resulting therefrom is greater than the current value of the direct current which results from the DC voltage. This can contribute to particularly rapid and/or effective heating of the organic light-emitting component. The root mean square value may also be referred to as the RMS value or quadratic mean.

BRIEF DESCRIPTION OF THE DRAWINGS

Embodiments of the present disclosure are represented in the drawings and will be explained in more detail below.

Figure 1:
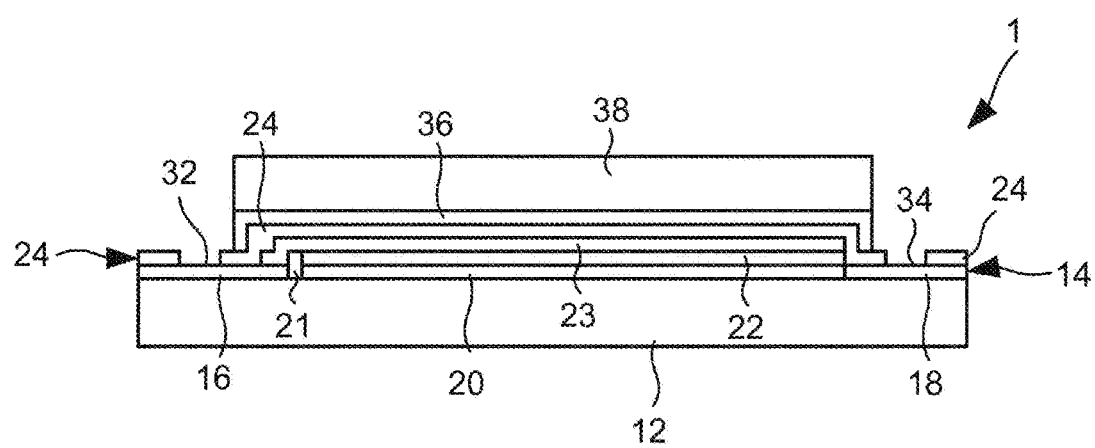
FIG. 1 shows a sectional representation of one embodiment of an organic light-emitting component.

In the following detailed description, reference is made to the attached drawings which form part of the present disclosure and in which specific embodiments may be carried out are shown for illustration. Since component parts of embodiments may be positioned in a number of different orientations, the direction terminology serves for illustration and is in no way restrictive. It is to be understood that other embodiments that are not explicitly provided may be used, and structural or logical modifications may be carried out, without departing from the subject matter of the present disclosure. It is to be understood that the features of the various embodiments described herein may be combined with one another, unless otherwise specifically indicated. The following detailed description is therefore not to be interpreted in a restrictive sense, and the subject matter of the present disclosure may be defined herein to include subject matter that is not expressly provided. In the drawings, elements which are identical or similar are provided with identical references, insofar as this is expedient.

DETAILED DESCRIPTION

An optoelectronic assembly may include one, two or more organic light-emitting components. Optionally, an optoelectronic assembly may also include one, two or more electronic components. An electronic component may, for example, include an active and/or a passive component. An active electronic component may, for example, include a computation, sensor, control and/or regulating unit and/or a transistor. A passive electronic component may, for example, include a capacitor, a resistor, a diode or an inductor.

An organic light-emitting component may, in various embodiments, be an organic light-emitting semiconductor component and/or be configured as an organic light-emitting diode, in particular as an OLED, or as an organic light-emitting transistor. The light may, for example, be light in the visible range, UV light and/or infrared light. The organic light-emitting component may, in various embodiments, be part of an integrated circuit. Furthermore, a multiplicity of organic light-emitting components may be provided, for example accommodated in a common housing of the optoelectronic assembly.

FIG. 1 shows one embodiment of an optoelectronic component 1. The optoelectronic component 1 includes a carrier 12. The carrier 12 may be configured to be translucent or transparent. The carrier 12 serves as carrier element for electronic elements or layers, for example light-emitting elements. The carrier 12 may for example include or be formed from plastic, metal, glass, quartz and/or a semiconductor material. The carrier 12 may furthermore include or be formed from a plastic film or a laminate of one or more plastic films. The carrier 12 may be configured to be mechanically rigid or mechanically flexible.

An optoelectronic layer structure is formed on the carrier 12. The optoelectronic layer structure includes a first electrode layer 14, which includes a first contact section 16, a second contact section 18 and a first electrode 20. The carrier 12 with the first electrode layer 14 may also be referred to as the substrate. A first barrier layer (not represented), for example a first barrier thin film, may be formed between the carrier 12 and the first electrode layer 14.

The first electrode 20 is electrically insulated from the first contact section 16 by means of an electrical insulation barrier 21. The second contact section 18 is electrically coupled to the first electrode 20 of the optoelectronic layer structure. The first electrode 20 may be configured as an anode or as a cathode. The first electrode 20 may be configured to be translucent or transparent. The first electrode 20 includes an electrically conductive material, for example metal and/or a transparent conductive oxide (TCO), or a layer stack of a plurality of layers which include metals or TCOs. The first electrode 20 may, for example, include a layer stack of a combination of a layer of a metal on a layer of a TCO, or vice versa. One example is a silver (Ag) layer, which is applied on an indium tin oxide (ITO) layer (Ag on ITO), or ITO-Ag-ITO multilayers. As an alternative or in addition to the materials mentioned, the first electrode 20 may include: networks of metal nanowires and nanoparticles, for example of Ag, networks of carbon nanotubes, graphite particles and graphite layers and/or networks of semiconducting nanowires.

Formed over the first electrode 20, there is an optically functional layer structure, for example an organic functional layer structure 22, of the optoelectronic layer structure. The organic functional layer structure 22 may for example include one, two or more sublayers. For example, the organic functional layer structure 22 may include a hole injection layer, a hole transport layer, an emitter layer, an electron transport layer and/or an electron injection layer. The hole injection layer is used to reduce the band gap between the first electrode and the hole transport layer. In the hole transport layer, the hole conductivity is greater than the electron conductivity. The hole transport layer is used for transporting the holes. In the electron transport layer, the electron conductivity is greater than the hole conductivity. The electron transport layer is used for transporting the holes. The electron injection layer is used to reduce the band gap between the second electrode and the electron transport layer. Furthermore, the organic functional layer structure 22 may include one, two or more functional layer structure units, which respectively include the aforementioned sublayers and/or further intermediate layers.

Formed over the organic functional layer structure 22, there is a second electrode 23 of the optoelectronic layer structure, which is electrically coupled to the first contact section 16. The second electrode 23 may be formed according to one of the configurations of the first electrode 20, in which case the first electrode 20 and the second electrode 23 may be configured identically or differently. The first electrode 20 is used, for example, as an anode or cathode of the optoelectronic layer structure. In accordance with the first electrode, the second electrode 23 is used as a cathode or anode of the optoelectronic layer structure.

The optoelectronic layer structure is an electrically and/or optically active region. The active region is, for example, the region of the optoelectronic component 10 in which electrical current for operation of the optoelectronic component 10 flows and/or in which electromagnetic radiation is generated or absorbed. A getter structure (not represented) may be arranged on or over the active region. The getter layer may be configured to be translucent, transparent or opaque. The getter layer may include or be formed from a material which absorbs and binds substances that are harmful to the active region.

Formed over the second electrode 23 and partially over the first contact section 16 and partially over the second contact section 18, there is an encapsulation layer 24 of the optoelectronic layer structure which encapsulates the optoelectronic layer structure. The encapsulation layer 24 may be configured as a second barrier layer, for example as a second barrier thin film. The encapsulation layer 24 may also be referred to as thin-film encapsulation. The encapsulation layer 24 forms a barrier against chemical contaminants or atmospheric substances, in particular against water (moisture) and oxygen. The encapsulation layer 24 may be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof. Optionally, the first barrier layer may be formed on the carrier 12 in accordance with one configuration of the encapsulation layer 24.

In the encapsulation layer 24, a first recess of the encapsulation layer 24 is formed over the first contact section 16 and a second recess of the encapsulation layer 24 is formed over the second contact section 18. A first contact region 32 is exposed in the first recess of the encapsulation layer 24 and a second contact region 34 is exposed in the second recess of the encapsulation layer 24. The first contact region 32 is used for electrically contacting the first contact section 16 and the second contact region 34 is used for electrically contacting the second contact section 18.

A bonding layer 36 is formed over the encapsulation layer 24. The bonding layer 36 includes for example a bonding agent, for example an adhesive, for example a laminating adhesive, a coating and/or a resin. The bonding layer 36 may, for example, include particles which scatter electromagnetic radiation, for example light-scattering particles.

A cover body 38 is formed over the bonding layer 36. The bonding layer 36 is used for fastening the cover body 38 on the encapsulation layer 24. The cover body 38 includes, for example, plastic, glass and/or metal. For example, the cover body 38 may be formed essentially from glass and include a thin metal layer, for example a metal foil, and/or a graphite layer, for example a graphite laminate, on the glass body. The cover body 38 is used to protect the optoelectronic component 1, for example against the effects of mechanical force from the outside. Furthermore, the cover body 38 may be used to distribute and/or dissipate heat which is generated in the optoelectronic component 1. For example, the glass of the cover body 38 may be used as protection against external influences, and the metal layer of the cover body 38 may be used to distribute and/or dissipate the heat given off during operation of the optoelectronic component 1.

Figure 2:
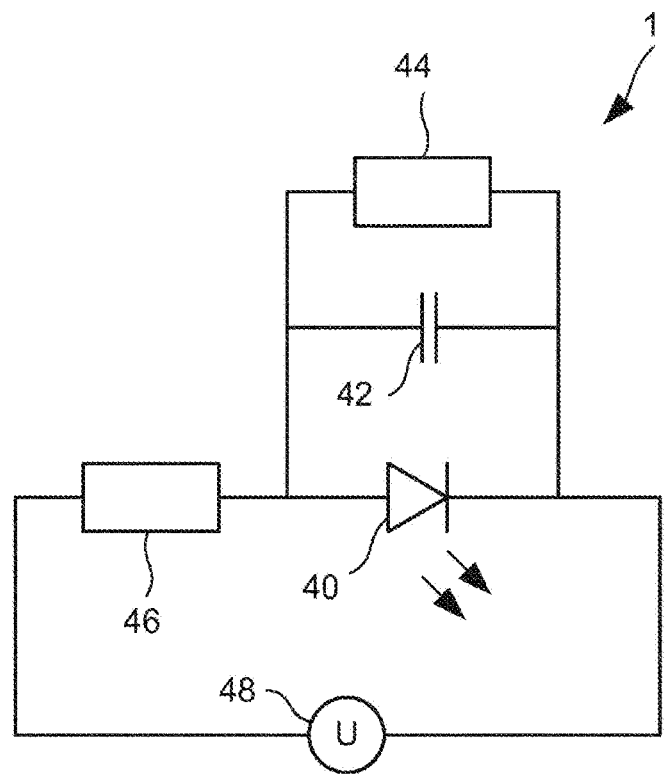
FIG. 2 shows an equivalent circuit diagram of the organic light-emitting component according to FIG. 1.

FIG. 2 shows an equivalent circuit diagram of the organic light-emitting component 1 according to FIG. 1. Because of its diode-like behavior, the organic functional layer structure 22 is represented as a diode 40. In addition to the diode 40, the equivalent circuit diagram includes a capacitor 42 and a bulk resistor 44, which are connected in parallel with the diode 40 and in parallel with one another. The capacitor 42 is formed by the electrodes 20, 23. The bulk resistor 44 is representative of one or more electrical resistances of one or correspondingly more leakage current paths between the electrodes 20, 23. Furthermore, the equivalent circuit diagram includes an electrode resistance 46, which is connected in series with the diode 40, the capacitor 42 and the bulk resistor 44 and is representative of the electrical resistances of the two electrodes 20, 23 or of the electrical resistance of the first electrode 20, if the electrical resistance of the second electrode is neglected. In addition, a voltage source 48 is represented. The voltage source 48 may for example be part of a controller, which will be explained in more detail below with reference to FIG. 5.

If a voltage, for example a DC voltage, which is greater than an instantaneous threshold voltage of the diode 40, is then applied by means of the voltage source 48 to the electrode resistance 46 and the diode 40, normal operation of the diode 40 begins, the diode 40 becomes luminescent and the organic functional layer structure 22 emits light.

If a voltage which is less than the instantaneous threshold voltage of the diode 40 is applied by means of the voltage source 48 to the electrode resistance 46 and the diode 40, the diode 40 does not become luminescent and the diode 40 may be considered absent from the equivalent circuit diagram for the function of the organic light-emitting component 1. The residual parasitic elements of the equivalent circuit diagram remain, in particular the electrode resistance 46, the capacitor 42 and the bulk resistor 44.

What is of interest in this case is, in particular, the capacitor 42. This is not transmissive for the direct current, particularly during normal operation of the organic light-emitting component 1, but represents only an alternating-current impedance for alternating current. This alternating-current impedance is commensurately lower when the capacitance is higher and/or the frequency of the AC voltage is higher. If the capacitor 42 as an alternating-current impedance is made to have a very low impedance with an AC voltage having a high frequency, the organic light-emitting component 1 can therefore be operated with a high alternating-current even with a low AC voltage, i.e. an AC voltage having a low amplitude. Because of the series circuit, this alternating-current necessarily flows through the electrode resistance 46 and causes a voltage drop and heat loss there. The first electrode 20 is thereby heated directly, and the organic functional layer structure 22 is heated indirectly by means of the first electrode 20. This heating is very efficient and takes place "from the inside out". This effect may be used as a heating process before normal operation of the organic light-emitting component 1 when switching the organic light-emitting component 1 on.

If the AC voltage, even at maximum amplitude, is less than the instantaneous threshold voltage of the organic light-emitting component 1, only a negligibly small current or no current at all flows through the organic functional layer structure 22. If the AC voltage at maximum amplitude is somewhat greater than the instantaneous threshold voltage, current flows at least temporarily through the organic functional layer structure 22.

Figure 3:
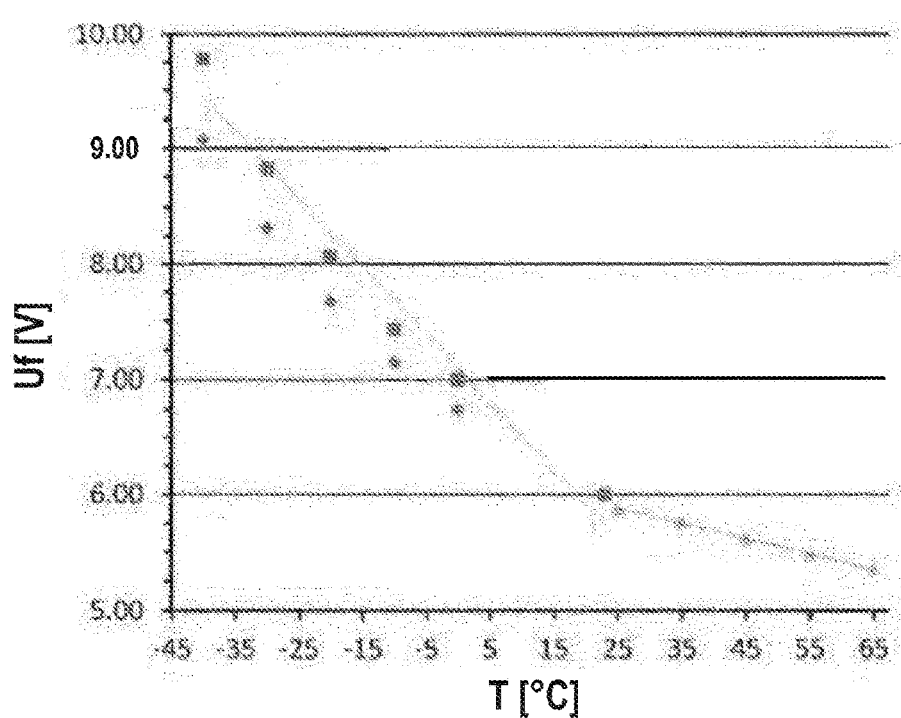
FIG. 3 shows one example of a temperature/voltage diagram.

FIG. 3 shows a temperature/voltage diagram in which forward voltages during normal operation, i.e. during luminescent operation, of the organic light-emitting component 1 are represented as a function of an external temperature T of an environment of the organic light-emitting component 1. In particular, the square measurement points are representative of values of the forward voltage at the corresponding external temperatures T when switching on the corresponding OLED. The triangular measurement points are representative of values of the forward voltage at the corresponding external temperatures T after a predetermined time duration, for example after a couple of minutes, after switching on the corresponding OLED. The diamond-shaped measurement points are representative of values of the forward voltage at the corresponding temperatures when switching on the corresponding OLED and after the predetermined time duration, since at these temperatures the values no longer differ from one another substantially and/or no longer significantly. The OLED corresponds essentially to the organic light-emitting component 1 as explained above.

The temperature/voltage diagram shows that, with a decreasing external temperature T, the forward voltage required when switching on for normal operation increases, and that during operation of the OLED, for the same external temperature and with an increasing internal temperature, the forward voltage required for normal operation decreases. Without heating of the OLED, operation of the OLED throughout the entire temperature range would require a controller which is capable of providing the entire represented range of forward voltages, even if the particularly low temperatures, for example below −15° C., occur only seldom. Such a controller would be relatively expensive.

If a plurality of OLEDs are connected in series, this effect is multiplied by the number of OLEDs connected in series. If for example ten OLEDs are connected in series, the required forward voltage of which is respectively reduced by 1 V by means of the heating, then a voltage lower overall by 10 V is needed in order to be able to normally operate the OLEDs connected in series.

In the automotive sector, situations are known in which the on-board voltage drops to 9 V, for example when starting a motor vehicle. This low on-board voltage may possibly no longer be sufficient when cold in order to be able to normally operate an OLED or two or more OLEDs connected in series. If the OLEDs are used for example as taillights, this would not be acceptable. However, even with an AC voltage of 9 V, a very high alternating-current can be achieved, in particular a very high RMS current value of the alternating current, so that very rapid heating is possible, by means of which the threshold value voltages of the OLEDs involved can be reduced rapidly, so that they can be operated even with the low on-board voltage.

Figure 4:
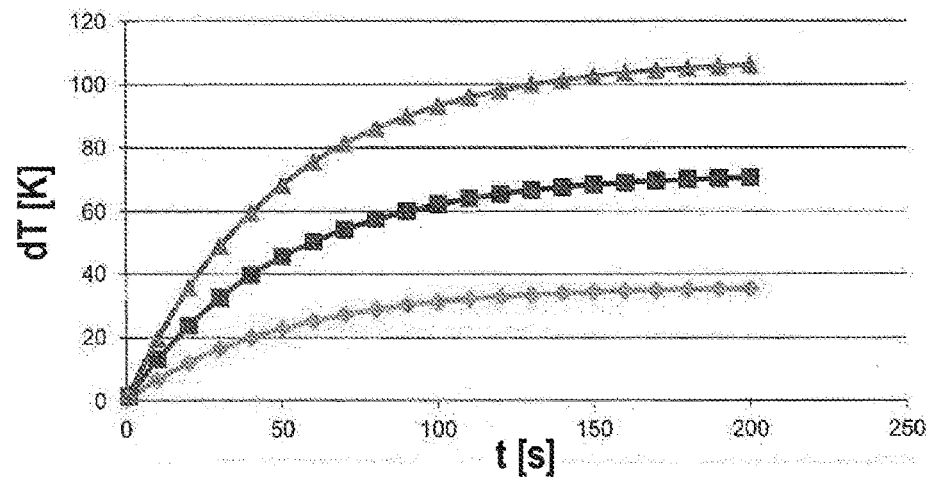
FIG. 4 shows one example of a time/temperature-difference diagram.

FIG. 4 shows a time/temperature-difference diagram, in which the temperature difference is indicated as a function of time for different electrical powers. In particular, the diamond-shaped measurement points were recorded at a power of 2 W, the square measurement points at a power of 4 W and the triangular measurement points at a power of 6 W. The time/temperature-difference diagram shows that the time within which a desired temperature change can be achieved in the organic light-emitting component 1 depends on the electrical power introduced.

If the normal power of the OLED is for example 2 W, the OLED would be stabilized, i.e. heated by 35° C., after about 160 s. But if a thermal power of for example 6 W is applied after switching on the OLED and before normal operation of the OLED, the desired 35° C. would already be achieved after about 20 s. After this, normal operation may be started. Because of the heating process by means of the AC voltage, normal operation can therefore already be started 120 s earlier than without heating.

Figure 5:
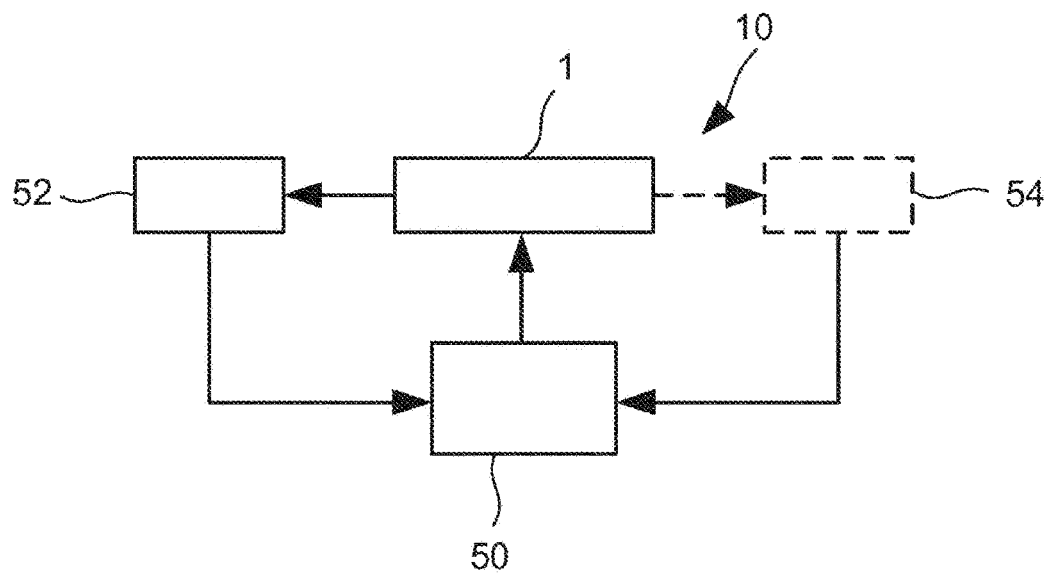
FIG. 5 shows a block diagram of one embodiment of an optoelectronic assembly.

FIG. 5 shows a block diagram of one embodiment of an optoelectronic assembly 10. The optoelectronic assembly 10 includes an organic light-emitting component, for example the organic light-emitting component 1 explained above, a controller 50, a first sensor 52 and optionally a second sensor 54. The controller 50 may, for example, be a driver. The first sensor 52 is a temperature sensor. The first sensor 52 is used to record a temperature value. The temperature value is representative of a temperature of the organic light-emitting component 1, in particular the organic functional layer structure 22, and/or an environment of the organic light-emitting component 1. As an alternative thereto, the first sensor 52 may be a current sensor for recording a current value of a forward current which flows through the organic light-emitting component 1, or a clock for recording a time value of a time duration which has elapsed since the organic light-emitting component 1 was switched on. Optionally and by way of example, when the first sensor 52 is the temperature sensor, the second sensor 54 may be the current sensor or the clock. Furthermore, the optoelectronic assembly 10 may include a storage medium (not represented).

The controller 50 is used to process the measurement values recorded by means of the sensors 52, 54 and to control and/or regulate the organic light-emitting component 1 as a function of the measurement values recorded. In particular, the controller 50 is used to switch on the organic light-emitting component 1 and to heat it before normal operation, then operate it during normal operation, or to switch on the organic light-emitting component and only if necessary to heat it before normal operation, then operate it during normal operation.

The heating may, for example, be identified as necessary by the controller 50 if the temperature value recorded is less than a predetermined temperature threshold value.

Figure 6:
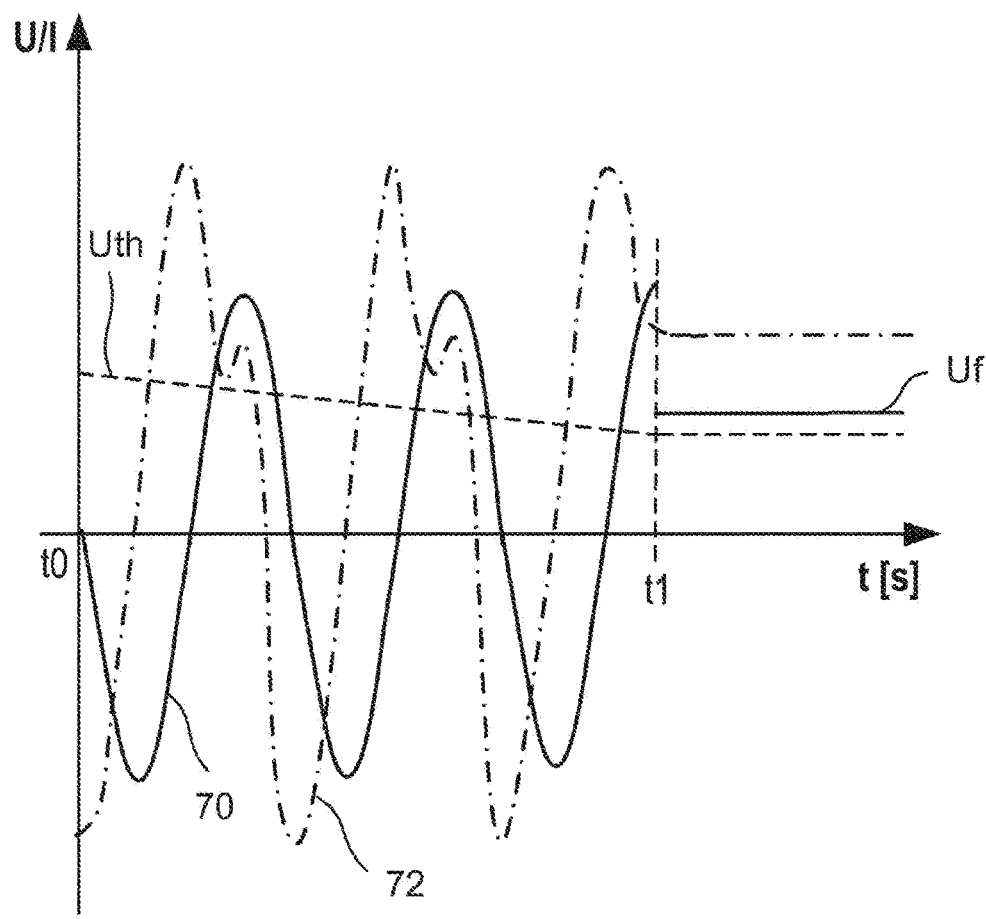
FIG. 6 shows one example of a time/voltage diagram.
Figure 7:
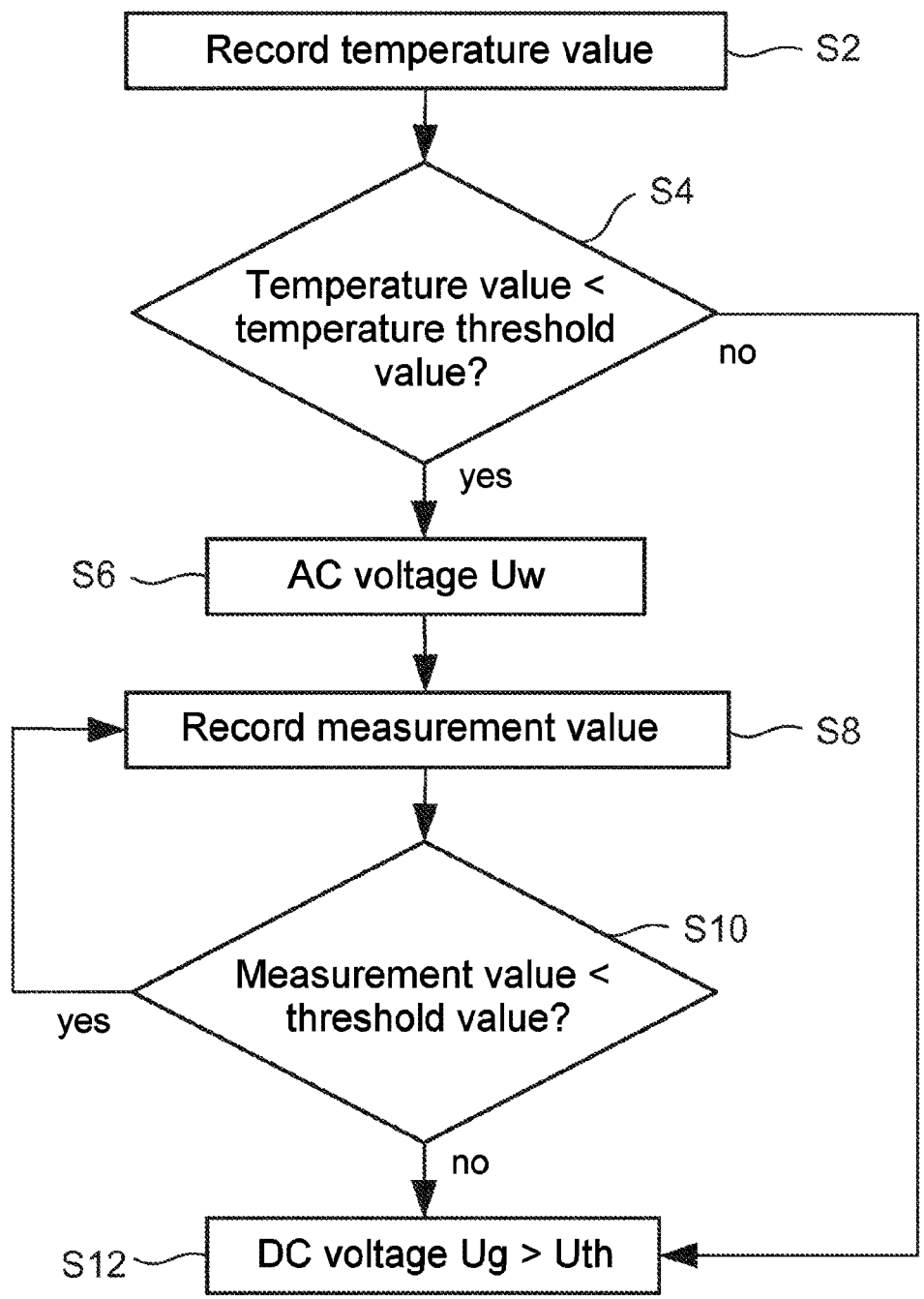
FIG. 7 shows a flow chart of one embodiment of a method for operating an optoelectronic assembly.

FIG. 6 and FIG. 7 together serve to explain one embodiment of a method for operating an optoelectronic assembly, for example the optoelectronic assembly 10 explained above.

FIG. 6 shows a time/voltage diagram, in which a first voltage profile 70 of an AC voltage, which is applied to the organic light-emitting component 1 during a heating phase, and a forward voltage Uf, which is applied to the organic light-emitting component 1 during normal operation, are represented as a solid line. An instantaneous threshold voltage Uth is furthermore represented as a dashed line. In FIG. 6, the instantaneous threshold voltage Uth decreases with time during the heating phase, since the internal temperature of the organic light-emitting component 1 increases.

Besides the voltages mentioned, a first current profile 72 of the current with which the organic light-emitting component 1 is operated is represented as a dot-and-dash line in the diagram shown in FIG. 6.

The represented oscillation of the AC voltage begins shortly after an instant t0 at which the organic light-emitting component 1 was switched on and it was identified that the temperature of the organic light-emitting component 1 is so low that it needs to be heated before adopting normal operation. The heating phase is initiated. The AC voltage is applied until an instant t1 at which it is identified that further heating of the organic light-emitting component 1 is no longer necessary. The heating phase is ended. At the instant t1, a DC voltage, in particular the forward voltage Uf, is applied to the organic light-emitting component 1. The forward voltage Uf is less than the instantaneous threshold voltage Uth at the instant t0, and is greater than the instantaneous threshold voltage Uth at the instant t1 and thereafter.

The first current profile 72 follows the first voltage profile 70. The first current profile 72 follows the first voltage profile 70 in the time intervals in which the AC voltage is less than the instantaneous threshold voltage Uth and in which no current flows through the organic functional layer structure 22, and no light is emitted, with a phase shift of approximately 90°. The first current profile 72 follows the first voltage profile 70 in the time intervals in which the AC voltage is greater than the instantaneous threshold voltage Uth and in which current therefore flows through the organic functional layer structure 22, and light is emitted, without a significant phase shift. After application of the DC voltage at the instant t1 and start of normal operation, direct current flows through the organic light-emitting component 1. The maximum amplitude of the first current profile 72 before the instant t1, i.e. during the heating phase, is greater than the constant value of the first current profile after the instant t1, i.e. during normal or rated operation. This can contribute to the RMS current value being particularly high during the heating phase, so that particularly rapid heating takes place.

The first voltage profile 70 is sinusoidal. As an alternative thereto, the first voltage profile 70 may, for example, be sawtoothed or trapezoidal and/or bipolar or unipolar. The AC voltage is radiofrequency, for example in the kilohertz to megahertz range. The AC voltage may be configured as a function of the capacitance of the capacitor 42, the electrode resistance 46 and/or the threshold voltage Uth of the organic light-emitting component 1. The first voltage profile 70 may, in particular, run substantially below the instantaneous threshold voltage Uth, although it may also exceed the instantaneous threshold voltage Uth. In particular, the maximum amplitude of the first voltage profile 70 may exceed the instantaneous threshold voltage Uth. The former is for example particularly suitable for OLEDs having a high threshold voltage Uth, for example for OLEDs having multiply stacked organic functional layer structures 22, since these can be heated with a particularly high current at a particularly low frequency.

The heating power may, for example, be selected in such a way that the light-emitting component 1 is heated particularly rapidly but not to an unnecessarily great extent. For example, a maximum desired temperature change may be selected in such a way that it corresponds to the temperature change may be during normal operation of the organic light-emitting component 1, which is set up in a steady state after a sufficiently long time. This temperature change may, for example, be determined empirically in the factory. The heating energy may be adjusted by means of the frequency, the voltage amplitude and the time duration of the heating. In particular, the voltage and frequency may be selected in such a way that the current amplitude and/or the RMS current value of the alternating current are greater than the current value of the direct current during normal or rated operation. For example, the RMS value of the alternating current may lie in the range of from one to twenty times the rated current, for example in the range of from three to fifteen times the rated current or in the range of from five to ten times the rated current. The rated operating current may, for example, be the direct current which is set up beyond the instant t1.

FIG. 7 shows a flow chart of one embodiment of a method for operating an optoelectronic assembly, for example the optoelectronic assembly 10 explained above. The method is used to identify whether heating of the organic light-emitting component 1 is necessary, to carry out the heating when it is necessary, and to end the heating when it is no longer necessary, and then to switch over into normal operation. The method is carried out, in particular by the controller 50, when the organic light-emitting component 1 is switched on.

In a step S2, the temperature value is recorded, for example with the aid of the first sensor 52 explained above.

In a step S4, a check is made whether the temperature value recorded is less than a predetermined temperature threshold value. If the condition in step S4 is satisfied, the processing is continued in a step S6. If the condition in step S4 is not satisfied, the processing is continued in a step S12.

In the step S6, an AC voltage Uw is applied to the organic light-emitting component 1. The AC voltage Uw is at least temporarily less than the instantaneous threshold voltage Uth of the organic light-emitting component 1.

In a step S8, a measurement value is recorded. In particular, a temperature value may again be recorded. As an alternative thereto, a current value of a forward current which flows through the organic functional layer structure 22 may be recorded, or a time value of a time duration which has elapsed since the organic light-emitting component 1 was switched on may be recorded. If the current value is recorded as the measurement value, a maximum of the alternating current amplitude may for example be recorded or measured as the measurement value.

In a step S10, a check is made whether the measurement value recorded is less than a predetermined threshold value. In the case of the temperature value, a check may be made whether the temperature value recorded is less than the predetermined temperature threshold value. The temperature threshold value specified in step S10 may be the same temperature threshold value or a different temperature threshold value than the temperature threshold value specified in step S4.

As an alternative thereto, in step S10 a check may be made whether the current value is less than a predetermined current threshold value or the time value is less than a predetermined time threshold value. The predetermined current threshold value and/or the predetermined time threshold value may, for example, be determined in the factory and specified in such a way that the organic functional layer structure 22 reliably has a sufficient temperature for normal operation when they are exceeded. The predetermined current threshold value may lie in a range of for example from 20% to 100% of the OLED rated operating current, for example from 40% to 90% of the rated operating current, for example from 60% to 80% of the rated operating current. The predetermined time threshold value may lie in a range of for example from 0.2 s to 30 s, in particular from 0.5 s to 10 s, for example from 1 to 5 s. If the condition in step S10 is satisfied, the processing is continued again in step S8. If the condition of step S10 is not satisfied, the processing is continued in step S12.

In step S12, a DC voltage Ug is applied to the organic light-emitting component 1, the DC voltage Ug being greater than the instantaneous threshold voltage Uth. In other words, normal operation is entered in step S12, while steps S2 to S10 represent the heating process after switching on and before normal operation of the organic light-emitting component 1.

Figure 8:
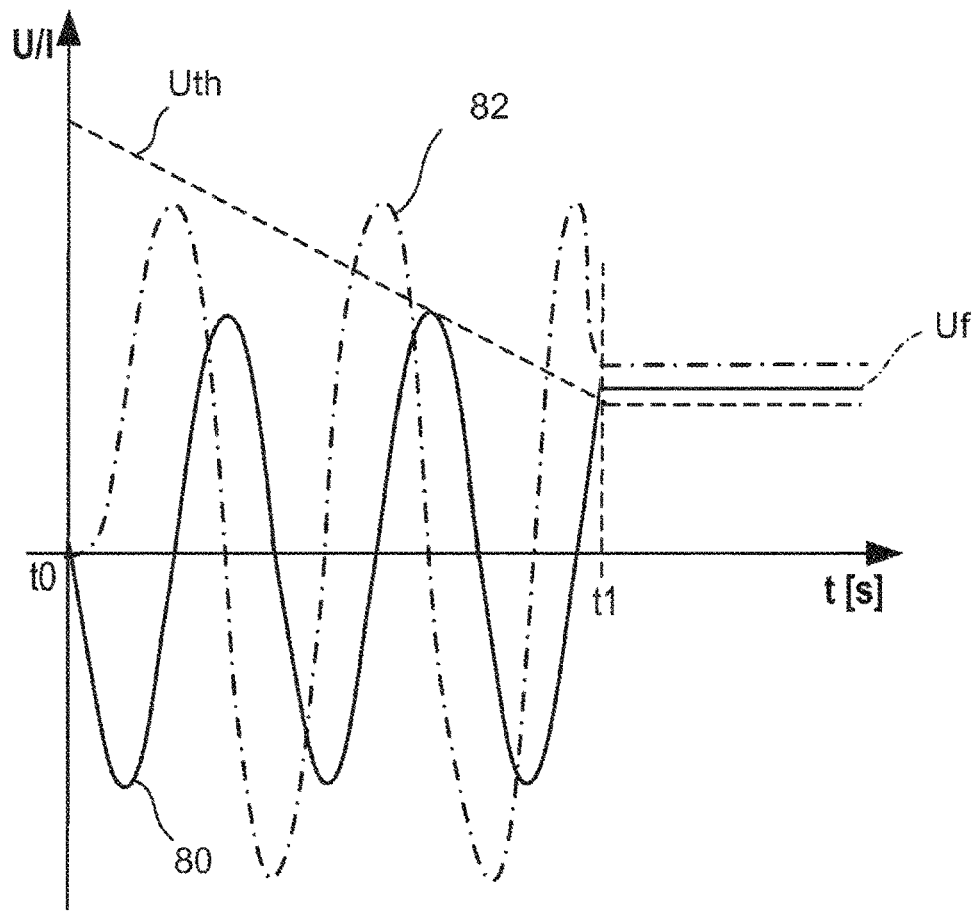
FIG. 8 shows one example of a time/voltage diagram.
Figure 9:
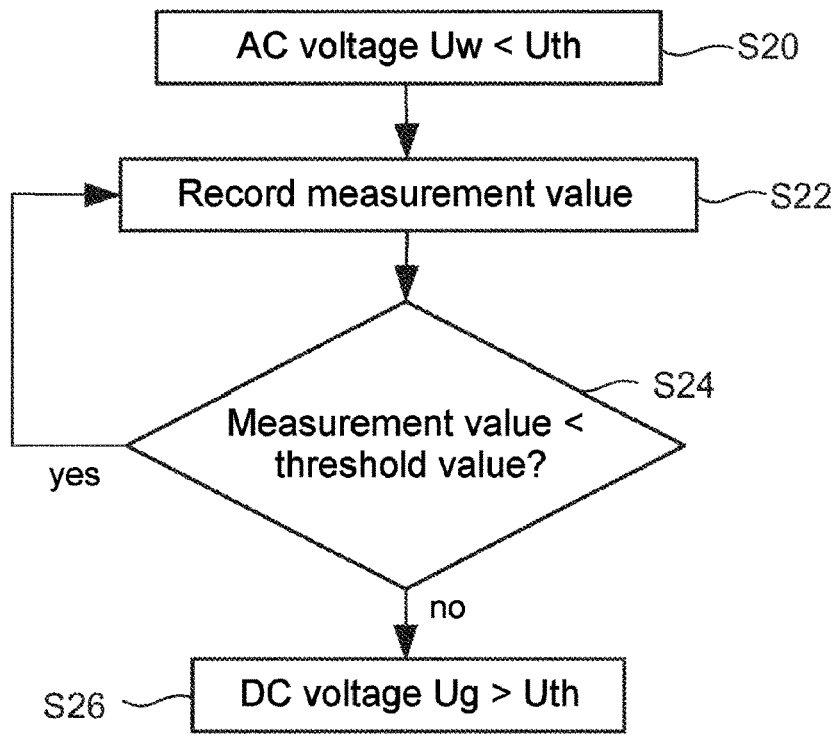
FIG. 9 shows a flow chart of one embodiment of a method for operating an optoelectronic assembly.

FIG. 8 and FIG. 9 together serve to explain one embodiment of a method for operating an optoelectronic assembly, for example the optoelectronic assembly 10 explained above.

FIG. 8 shows a time/voltage diagram, in which a second voltage profile 80 of an AC voltage, which is applied to the organic light-emitting component 1 during the heating phase, and a forward voltage Uf, which is applied to the organic light-emitting component 1 during normal operation, are represented as a solid line. An instantaneous threshold voltage Uth is furthermore represented as a dashed line. The instantaneous threshold voltage Uth decreases during the heating phase because of the increasing internal temperature of the organic light-emitting component 1.

Besides the voltages mentioned, a second current profile 82 of the current with which the organic light-emitting component 1 is operated is represented as a dot-and-dash line in the diagram shown in FIG. 8.

The represented oscillation of the AC voltage begins at an instant t0 at which the organic light-emitting component 1 was switched on. The AC voltage is used to heat the organic light-emitting component 1, and is mandatorily applied at least temporarily each time the organic light-emitting component 1 is switched on. The AC voltage is applied until an instant t1 at which it is identified that further heating of the organic light-emitting component 1 is no longer necessary. At the instant t1, a DC voltage, in particular the forward voltage Uf, is applied to the organic light-emitting component 1. The DC voltage is less than the instantaneous threshold voltage at the instant t0 and greater than the instantaneous threshold voltage Uth at the instant t1.

The second current profile 82 follows the second voltage profile 80 in the time intervals in which the AC voltage is less than the instantaneous threshold voltage Uth and in which no current flows through the organic functional layer structure 22, and no light is emitted, with a phase shift of 90°. After application of the DC voltage at the instant t1, and the start of normal operation, direct current flows through the organic light-emitting component 1, and the organic light-emitting component 1 emits light. The maximum amplitude of the second current profile 82 before the instant t1, i.e. during the heating phase, is greater than the constant value of the first current profile after the instant t1, i.e. during normal or rated operation. This can contribute to the RMS current value being particularly high during the heating phase, so that particularly rapid heating takes place.

The second voltage profile 80 is sinusoidal. As an alternative thereto, the second voltage profile 80 may be sawtoothed or trapezoidal and/or bipolar or unipolar. The AC voltage is radiofrequency, for example in the kilohertz to megahertz range. The AC voltage may be configured as a function of the capacitance of the capacitor 42, the electrode resistance 46 and/or the threshold voltage Uth of the organic light-emitting component 1. The maximum amplitude of the second voltage profile 80 is always less than the instantaneous threshold voltage Uth. This is particularly favorable for OLEDs having a high threshold voltage Uth, for example for OLEDs having multiply stacked organic functional layer structures 22, since these can be heated with a particularly high current at a particularly low frequency.

The heating power may, for example, be selected in such a way that the light-emitting component 1 is heated particularly rapidly but not to an unnecessarily great extent. For example, a maximum desired temperature change may be selected in such a way that it corresponds to the temperature change during normal operation of the organic light-emitting component 1, which is set up in a steady state after a sufficiently long time. This temperature change may, for example, be determined empirically in the factory. The heating energy may be adjusted by means of the frequency, the voltage amplitude and the time duration of the heating. In particular, the voltage and frequency may be selected in such a way that the current amplitude and/or the RMS current value of the alternating current are greater than the current value of the direct current during normal or rated operation. For example, the RMS value of the alternating current may lie in the range of from one to twenty times the rated current, for example in the range of from three to fifteen times the rated current or in the range of from five to ten times the rated current. The rated operating current may, for example, be the direct current which is set up beyond the instant t1.

FIG. 9 shows a flow chart of one embodiment of a method for operating an optoelectronic assembly, for example the optoelectronic assembly 10 explained above. The method is carried out each time the organic light-emitting component 1 is switched on. The method is used to carry out heating of the organic light-emitting component 1, to end the heating when it is no longer necessary, and then to switch over into normal operation. The method is carried out, in particular by the controller 50.

In a step S20, an AC voltage Uw is applied to the organic light-emitting component 1, the AC voltage Uw being at all times less than an instantaneous threshold voltage Uth of the organic light-emitting component 1.

In a step S22, a measurement value is recorded. For example, the temperature value is recorded. As an alternative thereto, the current value or the time value may be recorded.

In a step S24, a check is made whether the measurement value recorded is less than a predetermined threshold value. For example, a check is made whether the temperature value is less than the predetermined temperature threshold value, the current value is less than the predetermined current threshold value or the time value is less than the predetermined time threshold value. If the condition in step S24 is satisfied, processing is continued again in step S22. If the condition in step S24 is not satisfied, processing is continued in a step S26.

In step S26 a DC voltage Ug is applied to the organic light-emitting component 1, the DC voltage Ug being greater than the instantaneous threshold voltage Uth at the instant t1. In other words, normal operation, in particular luminescent operation, of the organic light-emitting component 1 is adopted in step S26.

The present disclosure is not restricted to the embodiments specified herein. For example, the threshold voltage Uth may vary in all embodiments. Furthermore, the voltage profiles may be selected in a different way than the voltage profiles represented in terms of their phase, amplitude and/or shape. Furthermore, the organic light-emitting component 1 may differ in detail from the organic light-emitting component 1 represented, in which case for example the cover body and/or the substrate may be omitted and/or it may include further electronic, optical and/or optoelectronic elements. Furthermore, the optoelectronic assembly 10 represented may include further electronic components, for example a storage medium, or further organic light-emitting components 1.

LIST OF REFERENCES

Organic light-emitting component 1
carrier 12
first electrode layer 14
first contact section 16
second contact section 18
first electrode 20
insulation barrier 21
organic functional layer structure 22
second electrode 23
encapsulation layer 24
first contact region 32
second contact region 34
bonding layer 36
cover body 38
diode 40
capacitor 42
bulk resistor 44
electrode resistance 46
voltage source 48
controller 50
first sensor 52
second sensor 54
forward voltage Uf
AC voltage Uw
threshold voltage Uth
DC voltage Ug
steps S2 to S26

The invention claimed is:

1. A method for an optoelectronic assembly including an organic light-emitting component, a temperature sensor and a driver circuit, the method comprising:
recording, by the temperature sensor, a temperature value in response to the organic light-emitting component being switched on;
determining, by the driver circuit, whether a first criteria is satisfied based on a comparison between the recorded temperature value and a predetermined temperature threshold value;
applying, by the driver circuit, an alternating current (AC) voltage to the organic light-emitting component in response to determining the first criteria is satisfied, wherein the AC voltage is, at least, temporarily less than an instantaneous threshold voltage of the organic light-emitting component;
recording a measurement value based on the application of the AC voltage to the organic light-emitting component;
determining, by the driver circuit, whether a second criteria is satisfied based on a comparison between the recorded measurement value and a predetermined threshold value; and
suspending, by the driver circuit, the application of the AC voltage to the organic light-emitting component in response to determining the second criteria is not satisfied,
wherein the recorded measurement value and the predetermined threshold value share a common basis in one of temperature, current, or time.

2. The method of claim 1,
wherein the common basis is temperature,
wherein the recorded measurement value is a further recorded temperature value, and
wherein the predetermined threshold value is the predetermined temperature threshold value.

3. The method of claim 1,
wherein the common basis is current,
wherein the recorded measurement value is a recorded current value of a forward current which flows through the organic light-emitting component, and
wherein the predetermined threshold value is a predetermined current threshold value.

4. The method of claim 1,
wherein the common basis is time,
wherein the recorded measurement value corresponds to a time duration which has elapsed since the organic light-emitting component was switched on, and
wherein the predetermined threshold value is a predetermined time threshold value.

5. The method of claim 1,
wherein the first criteria is satisfied when the recorded temperature value is less than the predetermined temperature threshold value.

6. The method of claim 1,
wherein the second criteria is not satisfied when the recorded measurement value is greater than or equal to the predetermined threshold value.

7. The method of claim 1,
wherein applying the AC voltage to the organic light-emitting component comprises:
regulating the AC voltage such that the AC voltage is always less than the instantaneous threshold voltage of the organic light-emitting component.

8. An optoelectronic assembly, comprising:
an organic light-emitting component;
a temperature sensor configured to record a temperature value; and
a controller coupled to the organic light-emitting component and to the temperature sensor,
wherein the controller is configured to:
determine whether a first criteria is satisfied based on a comparison between the recorded temperature value and a predetermined temperature threshold value,
apply an alternating current (AC) voltage to the organic light-emitting component in response to the organic light-emitting component being switched on and the first criteria being satisfied, wherein the AC voltage is, at least, temporarily less than an instantaneous threshold voltage of the organic light-emitting component,
determine whether a second criteria is satisfied based on a comparison between a recorded measurement value and a predetermined threshold value, and
suspend the application of the AC voltage to the organic light-emitting component in response to the second criteria not being satisfied,
wherein the recorded measurement value and the predetermined threshold value share a common basis in one of temperature, current, or time.

9. The optoelectronic assembly of claim 8,
wherein the controller is a driver circuit, and
wherein the controller is further configured to regulate the AC voltage such that the AC voltage is always less than the instantaneous threshold voltage of the organic light-emitting component.

10. The optoelectronic assembly of claim 8,
wherein the common basis is temperature,
wherein the recorded measurement value is a further recorded temperature value, and
wherein the predetermined threshold value is the predetermined temperature threshold value.

11. The optoelectronic assembly of claim 8,
wherein the first criteria is satisfied when the recorded temperature value is less than the predetermined temperature threshold value.

12. The optoelectronic assembly of claim 8,
wherein the second criteria is not satisfied when the recorded measurement value is greater than or equal to the predetermined threshold value.

13. An optoelectronic assembly, comprising:
an organic light-emitting component;
a measuring device configured to record a measurement value at a time after the organic light-emitting component is switched on and before normal operation of the organic light-emitting component; and
a driver circuit coupled to the organic light-emitting component,
wherein the driver circuit is configured to:
  apply an alternating current (AC) voltage to the organic light-emitting component in response to the organic light-emitting component being switched on, wherein the AC voltage is less than an instantaneous threshold voltage of the organic light-emitting component,
  determine whether a criteria is satisfied based on a comparison between the recorded measurement value and a predetermined threshold value, and
  suspend the application of the AC voltage to the organic light-emitting component after the organic light-emitting component is switched on and in response to the criteria not being satisfied,
wherein the recorded measurement value and the predetermined threshold value share a common basis in one of temperature, current, or time.

14. The optoelectronic assembly of claim 13,
wherein the common basis is temperature,
wherein the measuring device is a temperature sensor configured to record a temperature value,
wherein the recorded measurement value is the recorded temperature value, and
wherein the predetermined threshold value is a predetermined temperature threshold value.

15. The optoelectronic assembly of claim 13,
wherein the common basis is current,
wherein the measuring device is a current sensor configured to record a current value of a forward current which flows through the organic light-emitting component,
wherein the recorded measurement value is the recorded current value, and
wherein the predetermined threshold value is a predetermined current threshold value.

16. The optoelectronic assembly of claim 13,
wherein the common basis is time,
wherein the measuring device is a clock configured to record a time duration which has elapsed since the organic light-emitting component was switched on,
wherein the recorded measurement value corresponds to the time duration, and
wherein the predetermined threshold value is a predetermined time threshold value.

17. The optoelectronic assembly of claim 13,
wherein the criteria is not satisfied when the recorded measurement value is greater than or equal to the predetermined threshold value.

18. A method for operating an optoelectronic assembly including an organic light-emitting component, the method comprising:
applying an alternating current (AC) voltage to the organic light-emitting component in response to the organic light-emitting component being switched on, wherein the AC voltage is less than an instantaneous threshold voltage of the organic light-emitting component;
recording a measurement value at a time after the organic light-emitting component is switched on and before normal operation of the organic light-emitting component;
determining whether a criteria is satisfied based on a comparison between the recorded measurement value and a predetermined threshold value; and
suspending the application of the AC voltage to the organic light-emitting component in response to determining the criteria is not satisfied,
wherein the recorded measurement value and the predetermined threshold value share a common basis in one of temperature, current, or time.

19. The method of claim 18,
wherein applying the AC voltage to the organic light-emitting component comprises:
regulating the AC voltage such that the AC voltage is always less than the instantaneous threshold voltage of the organic light-emitting component.

20. The method of claim 18,
wherein the common basis is temperature,
wherein the recorded measurement value is a recorded temperature value, and
wherein the predetermined threshold value is a predetermined temperature threshold value.

21. The method of claim 18,
wherein the criteria is not satisfied when the recorded measurement value is greater than or equal to the predetermined threshold value.

* * * * *